United States Patent
Ausserlechner et al.

(10) Patent No.: US 7,054,123 B2
(45) Date of Patent: May 30, 2006

(54) CIRCUIT CONFIGURATION FOR IDENTIFYING A FAULT STATE

(75) Inventors: Udo Ausserlechner, Villach (AT); Ernst Bodenstorfer, Brunn Am Gebirge (AT)

(73) Assignee: Infineon Technologies AG, Munich (DE)

( * ) Notice: Subject to any disclaimer, the term of this patent is extended or adjusted under 35 U.S.C. 154(b) by 316 days.

(21) Appl. No.: 10/368,074

(22) Filed: Feb. 18, 2003

(65) Prior Publication Data

US 2003/0223162 A1    Dec. 4, 2003

Related U.S. Application Data

(63) Continuation of application No. PCT/DE01/03118, filed on Aug. 16, 2001.

(30) Foreign Application Priority Data

Aug. 16, 2000  (DE) ............................... 100 40 092

(51) Int. Cl.
    *H02H 3/20* (2006.01)
(52) U.S. Cl. ...................... 361/90; 361/91.1
(58) Field of Classification Search ................ 361/90, 361/91.1, 91.2, 92, 111, 86, 87; 326/56–58, 326/68, 81, 86
    See application file for complete search history.

(56) References Cited

U.S. PATENT DOCUMENTS

| 3,988,695 A | | 10/1976 | Mattfeld et al. |
| 4,168,471 A | * | 9/1979 | Sampei ...................... 330/264 |
| 4,678,950 A | | 7/1987 | Mitake |
| 4,691,129 A | | 9/1987 | Einzinger et al. |
| 4,973,861 A | * | 11/1990 | Dikken ......................... 326/88 |
| 6,081,132 A | * | 6/2000 | Isbara ........................ 326/81 |
| 6,400,546 B1 | * | 6/2002 | Drapkin et al. ............. 361/111 |
| 6,614,288 B1 | * | 9/2003 | Dagan et al. ................ 327/365 |
| 6,842,320 B1 | * | 1/2005 | Mathur et al. ............. 361/91.1 |

FOREIGN PATENT DOCUMENTS

| DE | 28 33 501 A1 | 2/1980 |
| DE | 100 08 180 A1 | 1/2001 |

* cited by examiner

*Primary Examiner*—Brian Sircus
*Assistant Examiner*—Danny Nguyen
(74) *Attorney, Agent, or Firm*—Laurence A. Greenberg; Werner H. Stemer; Ralph E. Locher

(57) ABSTRACT

To identify a fault state, for example, a break in a supply line, while maintaining operational reliability, a circuit configuration for identifying a fault state includes a first transistor of a normally on type having a voltage that pinches off its channel at a control input in a normal operating state and the channel of the transistor having low impedance in a fault state. As a result, preferably, the output of a linear amplifier stage can be connected to the intact potential in the event of a break in the supply line.

19 Claims, 3 Drawing Sheets

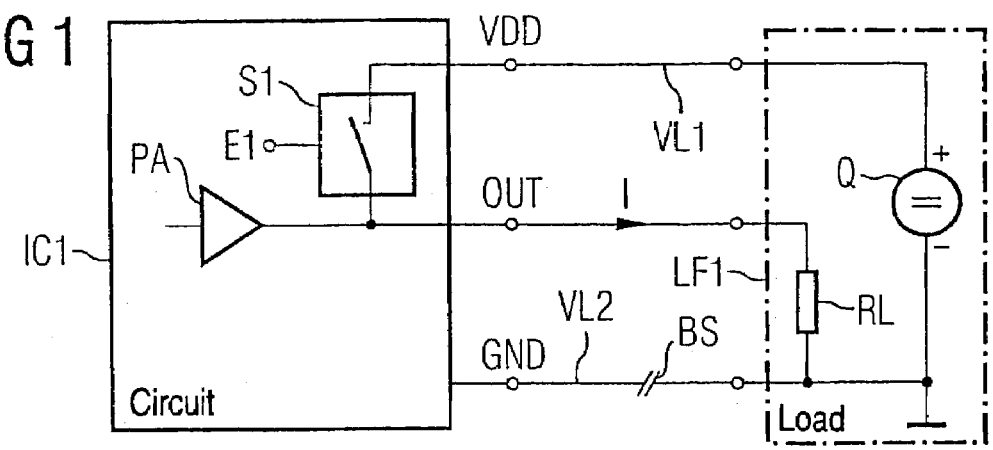
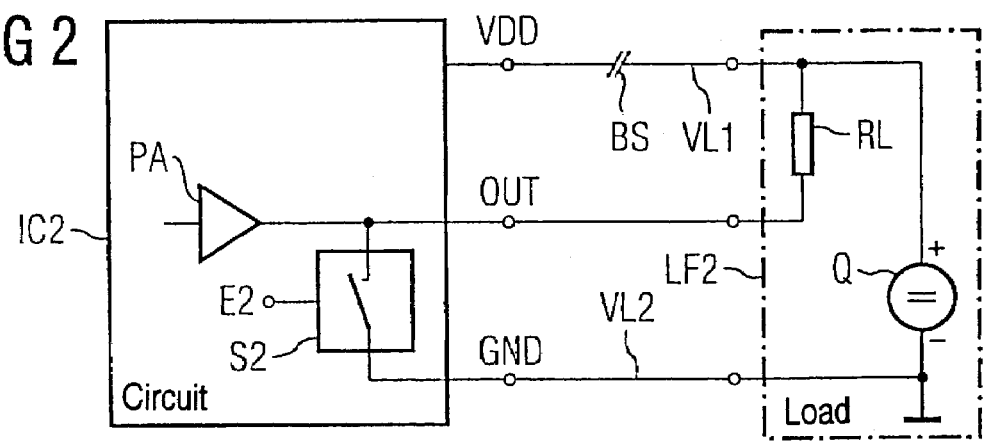
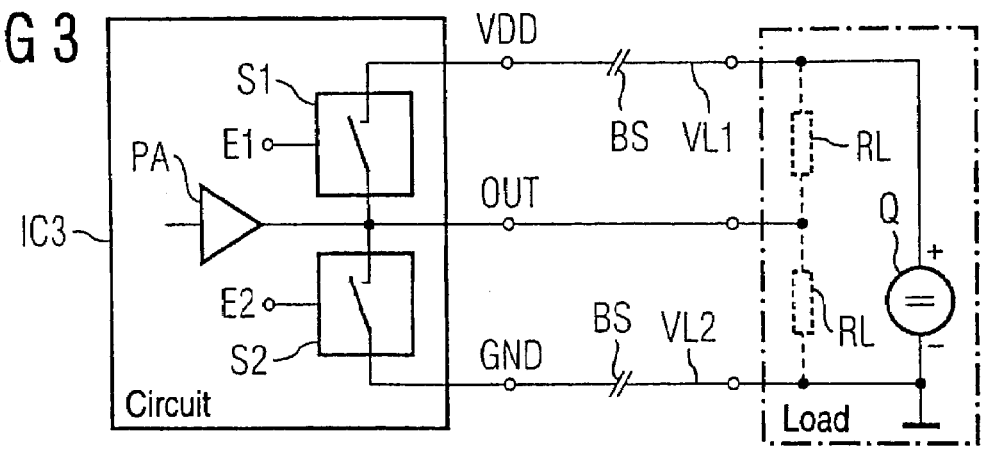

CIRCUIT CONFIGURATION FOR IDENTIFYING A FAULT STATE

CROSS-REFERENCE TO RELATED APPLICATION

This application is a continuation of copending International Application No. PCT/DE01/03118, filed Aug. 16, 2001, which designated the United States and was not published in English.

BACKGROUND OF THE INVENTION

Field of the Invention

The present invention relates to a circuit configuration for identifying a fault state.

For reasons of operational reliability, it is often necessary, in motor vehicles, for example, to provide integrated circuits to which electrical loads can be connected through long lines with a fault state identification. Such a fault state may exist, for example, when a supply line is interrupted.

It may be desirable, for example, in the event of a break or interruption in one of at least two supply lines, to connect the output-side terminal of a linear output stage to the respective other, intact supply line in a low-impedance manner. In a normal operating state, however, a high-impedance connection must exist between output terminal of the circuit configuration and the supply potential terminals to avoid high circuit power losses. Moreover, when a fault state occurs, the transition from a high-impedance to a low-impedance connection must take place very rapidly. Finally, on account of additional circuit measures, undesirable reactions may occur on the useful signals or the supply voltage.

The problem described could be solved by a high-voltage CMOS technology. However, this would mean an additional outlay.

SUMMARY OF THE INVENTION

It is accordingly an object of the invention to provide a circuit configuration for identifying a fault state that overcomes the hereinafore-mentioned disadvantages of the heretofore-known devices of this general type and that has a low power loss and a short response time and is suitable for large supply voltages.

With the foregoing and other objects in view, there is provided, in accordance with the invention, a circuit configuration for identifying a fault state, including three terminals including a first circuit node to be connected to a voltage source through an electrical load, a supply terminal to be connected to a voltage source, the supply terminal supplying a supply potential from the voltage source, and a ground terminal to be connected to the voltage source, the ground terminal supplying a reference-ground potential, a signal-processing circuit having an output connected to the first circuit node, a normally on type first transistor having a channel, a control input, a first load terminal connected to the first circuit node, and a second load terminal connected to one of the supply terminal and the ground terminal, the control input having a voltage present thereat pinching off the channel of the first transistor in a normal operating state, and the first and second load terminals of the first transistor being connected in a low-impedance manner through the channel in a fault state.

According to the invention, a circuit configuration for identifying a fault state, has three terminals, comprising a first circuit node, to which an electrical load can be connected, a terminal for a supply potential and a terminal for a reference-ground potential, which can be connected to a voltage source, a signal-processing circuit, whose output is connected to the first circuit node, a first transistor, which is of a normally on type, which has a first load terminal connected to the first circuit node, which has a second load terminal connected to the terminal for supply potential or reference-ground potential, a voltage which pinches off the channel of the first transistor being present at the control input of the first transistor in a normal operating state and the first and second load terminals of the transistor being connected in a low-impedance manner through the channel of the transistor in a fault state.

Normally on transistors are also referred to as transistors of a depletion type. To pinch off the channel in a normal operating state, a gate voltage of the first transistor can be pumped either above a positive supply potential or below a negative supply potential, thereby ensuring that the circuit configuration is decoupled. In the event of a fault, such a connection has low impedance so that the transistor acts as a nonlinear resistor on account of its circuitry.

In the circuit configuration, charge pumps may be provided for supplying the voltages that pinch off the channel, the charge pumps supplying a corresponding control voltage that lies outside the supply voltage of the circuit configuration. In the event of a fault, for example, when the supply voltage to which the charge pumps are connected for their supply is interrupted, the control voltage dips. As a result, the channel is no longer pinched off, the transistor is turned on and connects the first circuit node to the reference-ground or supply potential terminal in a low-impedance manner.

In accordance with another feature of the invention, the fault state exists when a supply line, which is connected to the circuit configuration and connects a voltage source to the terminal for supply or reference-ground potential, is interrupted or has a voltage below a minimum voltage limit. In such a case, the supply line connected to the circuit configuration may be long and be disposed between the circuit configuration and an electrical load connected directly to the voltage source.

In accordance with a further feature of the invention, the signal-processing circuit is a linear output stage. In the case of linear output stages, it may be advantageous, for reasons of operational reliability, in the event of a break in a supply line, to connect the output pin of the output stage to the remaining, intact supply line in a low-impedance manner.

In such a case, a fault state can easily be detected, for example, by virtue of the fact that a linear output stage has a drive range lying in a voltage interval that is less than the supply voltage so that a fault state identification is possible in a simple manner by fixing the output potential at a supply potential that is not encompassed by the drive range. By way of example, the linear output stage may have a drive range extending from 1 volt to 4 volts. If the output potential is less than 0.5 volts or greater than 4.5 volts, for example, and is, accordingly, near to the reference-ground potential or near to the supply potential, then a fault state can, thus, be detected in a simple manner.

In accordance with an added feature of the invention, the second load terminal of the first transistor is connected to a terminal for the supply potential and an electrical load, in a first load case, is connected on the one hand to the first circuit node and on the other hand to a terminal for the reference-ground potential. A fault state exists in this case when the supply line carrying the reference-ground potential is interrupted and, in this case, the first transistor produces a low-impedance connection between supply potential and first circuit node. In this case, a voltage source may be provided between supply potential and reference-ground potential, which voltage source may be connected to the electrical load on the load side. In a second load case, the electrical load may be disposed between first circuit node and supply potential, so that, when the supply line carrying the supply potential is interrupted, it is necessary to produce a low-impedance connection between first circuit node and reference-ground potential.

The electrical load may be a purely resistive load.

In accordance with an additional feature of the invention, there is provided a second transistor, which has a first load terminal connected to the terminal for the reference-ground potential and which has a second load terminal connected to the first circuit node, a voltage that pinches off the channel of the second transistor being present at the control input of the second transistor in normal operation.

Providing a second transistor in the circuit configuration has the advantage that a respective transistor is provided between first circuit node and a reference-ground and supply potential, respectively, so that a fault state can be identified independently of whether the electrical load is disposed between the first circuit node and supply potential or between first circuit node and reference-ground potential.

In accordance with yet another feature of the invention, the first and second transistors are P-channel JFETs. P-channel junction field-effect transistors (junction FETs) have the advantage that they are resistant to polarity reversal, that is to say, that the supply potential is permitted to become negative relative to the reference-ground potential without an impermissibly large current flowing in the process.

In accordance with yet a further feature of the invention, the first and second transistors are N-channel JFETs.

In accordance with yet an added feature of the invention, there is provided a third transistor, which, on the load side, is connected, on one hand, to the terminal for the supply potential and, on the other hand, to the first transistor, and a fourth transistor is provided, which, on the load side, is connected, on one hand, to the second transistor and, on the other hand, to the terminal for the reference-ground potential. Providing a plurality of transistors connected in series between in each case a first and a second circuit node has the advantage that the circuit configuration is suitable even for high applied voltages. In such a case, it suffices if, from a plurality of transistors that are connected to one another in series on the load side between first and second circuit node, at least one of the transistors is operated with a gate voltage that lies outside the supply voltage, that is to say, has a larger magnitude.

In accordance with yet an additional feature of the invention, there is provided a subcircuit for limiting the power loss, which is connected to the control inputs of the first, second, third and fourth transistors. The subcircuit for limiting the power loss enables operation of the transistors as nonlinear resistors independently of the polarity of the applied voltage.

In accordance with again another feature of the invention, which realizes one possible embodiment of the subcircuit, a first resistor is connected between supply potential and a load terminal of the third transistor, a second resistor is connected between first circuit node and first load terminal of the first transistor, a third resistor is connected between first circuit node and second load terminal of the second transistor, a fourth resistor is connected in parallel with a first diode between supply potential and a control input of the third transistor, at which a second diode is connected in series with a fifth resistor with respect to the first circuit node, a sixth resistor is connected, on one hand, to the first circuit node and, on the other hand, to the control input of the fourth transistor, a third diode and a fourth diode are connected, on one hand, to the first circuit node and, on the other hand, to a respective control input of the first and second transistor, and a fifth diode is connected on the one hand to the supply potential and on the other hand to a seventh resistor connected to the control input of the first transistor.

The described circuitry of the transistors has a low power loss firstly by virtue of the fact that the transistors acquire higher impedance at higher voltages, which still holds true even when the transistors are already being operated at breakdown. In addition, the power consumption of the circuit is limited even when the voltage that can be tapped off at the first circuit node is higher than the supply potential in that the control input of the first transistor is pulled up to the potential of the first circuit node by the fourth diode, while a voltage divider formed by fourth and fifth resistors sets a potential at the control input of the third transistor, which leads to breakdown of the third transistor only in the event of very high voltages between first circuit node and reference-ground potential.

In accordance with again a further feature of the invention, there are provided gate discharge resistors, of which a first gate discharge resistor is connected, on one hand, to the control terminal of the first and, on the other hand, to the control terminal of the second transistor and a second gate discharge resistor is connected, on one hand, to the control input of the first transistor and, on the other hand, to the supply potential. This results, first, in a low loading on a charge pump that provides the potential for the control inputs of first and second transistors in normal operation, and in a low electrical loading on the charge pump as a result of the decoupling of first and second control inputs even in the event of the breakdown of first or second transistor.

In accordance with again an additional feature of the invention, there are provided gate discharge resistors, a first of the gate discharge resistors being connected to the control input of the first transistor and to the control input of the second transistor, a second of the gate discharge resistors being connected to the control input of the first transistor and to the supply terminal.

In accordance with again an added feature of the invention, there are provided smoothing capacitors, of which a first is connected between second load terminal of the first transistor and control input of the first transistor and a second is connected between control input of the second transistor and second load terminal of the first transistor. Such a configuration of the smoothing capacitors avoids a high loading on the smoothing capacitors by high voltages present at the control inputs and, also, a protection against pulses that are coupled in electromagnetically or electrostatically, and prevents a punch-through of the capacitor discharge currents to the first circuit node.

In accordance with still another feature of the invention, there is provided a second transistor having a first load terminal connected to the ground terminal and a second load terminal connected to the supply terminal. The second transistor is connected between supply potential and reference-ground potential on the load side. As a result, in particular, when a load resistor is connected on the supply potential side and when a linear output stage is provided, a monotonic switch-on behavior of the potential is achieved at the first circuit node, the output of the output stage, because no transistor is necessary between first circuit node and supply potential. Moreover, the embodiment has improved overvoltage properties and reduced interference ripple.

In accordance with still a further feature of the invention, there is provided a device or means for detecting the fault state, the detecting device/means having an input side connected to the supply terminal and to the ground terminal and an output side connected to the first transistor.

With the objects of the invention in view, there is also provided a circuit configuration for identifying a fault state, including three terminals including a first circuit node to be connected to a voltage source and to which an electrical load is to be connected, a terminal for a supply potential to be connected to the voltage source, and a terminal for a reference-ground potential to be connected to the voltage source, a signal-processing circuit having an output connected to the first circuit node, a normally on type first transistor having a channel, a control input, a first load terminal connected to the first circuit node, and a second load terminal connected to one of the supply terminal and the ground terminal, the control input having a voltage present thereat pinching off the channel of the first transistor in a normal operating state, and the first and second load terminals of the first transistor being connected in a low-impedance manner through the channel in a fault state.

With the objects of the invention in view, there is also provided a circuit configuration for identifying a fault state, including an electrical circuit having a fault state, three terminals including a first circuit node to be connected to a voltage source through an electrical load, a supply terminal to be connected to a voltage source, the supply terminal supplying a supply potential from the voltage source, and a ground terminal to be connected to the voltage source, the ground terminal supplying a reference-ground potential, a signal-processing circuit having an output connected to the first circuit node, a normally on type transistor having a channel, a control input, a first load terminal connected to the first circuit node, and a second load terminal connected to one of the supply terminal and the ground terminal, and a normal operating state in which a voltage is present at the control input and pinches off the channel of the transistor, and a fault state in which the first and second load terminals of the transistor are connected in a low-impedance manner through the channel.

Other features that are considered as characteristic for the invention are set forth in the appended claims.

Although the invention is illustrated and described herein as embodied in a circuit configuration for identifying a fault state, it is, nevertheless, not intended to be limited to the details shown because various modifications and structural changes may be made therein without departing from the spirit of the invention and within the scope and range of equivalents of the claims.

The construction and method of operation of the invention, however, together with additional objects and advantages thereof, will be best understood from the following description of specific embodiments when read in connection with the accompanying drawings.

BRIEF DESCRIPTION OF THE DRAWINGS

FIG. 1 is a schematic and block circuit diagram of an exemplary embodiment according to the invention;

FIG. 2 is a schematic and block circuit diagram of the circuit of FIG. 1 applied to a second load case;

FIG. 3 is a schematic and block circuit diagram of a circuit configuration realized independently of the load case in accordance with FIGS. 1 and 2;

DESCRIPTION OF THE PREFERRED EMBODIMENTS

Figure 4:
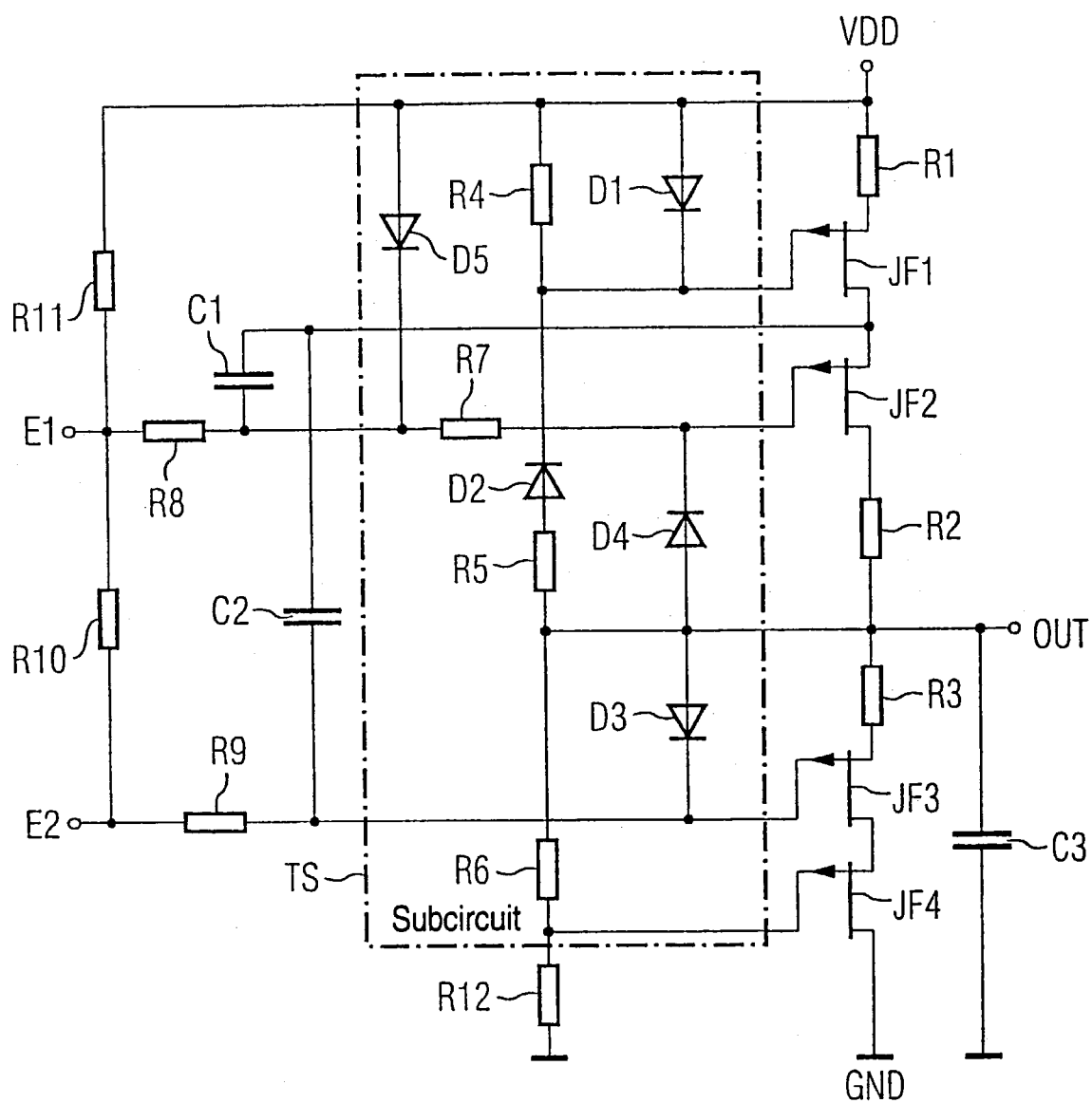
FIG. 4 is a schematic and block circuit diagram of a development of the circuit configuration IC3 from FIG. 3.

Referring now to the figures of the drawings in detail and first, particularly to FIG. 1 thereof, there is shown a first embodiment of the circuit configuration IC1 having a linear output stage PA, which has an output OUT, to which a first transistor S1 is connected on the load side, the transistor S1 being illustrated as a switch for simplification. The first transistor S1 has a control input E1 and, on the other hand, is connected to a supply potential VDD on the load side. The circuit configuration IC1 is additionally connected to a reference-ground potential GND. Furthermore, an electrical load RL is provided, which, in a first load case LF1, is connected as a so-called pull-down load resistor to the output OUT and also to the reference-ground potential GND through lines that may be long. A voltage source Q is connected to the electrical load RL on the reference-ground potential side, the positive pole of the voltage source Q being connected to the supply potential VDD. Supply lines VL1, VL2 are provided for carrying the supply and reference-ground potentials VDD, GND. If, in the event of a fault, the supply line VL2 has a break point BS, that is to say, a ground break, then, the first transistor S1 switches the output OUT of the output stage PA to the supply potential VDD. As a result, first, the circuit is protected and, second, it is possible to identify the fault case resulting from break BS in the ground line VL2.

FIG. 2 shows a second load case LF2, in which the load resistor RL is realized as a so-called pull-up load which is connected, on one hand, to the output OUT of the linear amplifier stage PA and, on the other hand, by a supply line VL1, to a supply potential VDD. As in FIG. 1, a voltage source Q is provided between supply and reference-ground potentials VDD, GND, the voltage source Q being connected to the electrical load RL. In such a case, a risk to the operational reliability could proceed from the occurrence of a break point BS in the supply line VL1 carrying the supply potential VDD, so that, in such a case, a second transistor S2 is provided, which, on the load side, is connected, on one hand, to the output OUT and, on the other hand, to the reference-ground potential GND and has a second control input E2. When a fault occurs, for example, due to the occurrence of a break point BS, the second transistor S2 produces a low-impedance connection between the output of the amplifier PA and reference-ground potential GND. FIG. 3 shows a circuit configuration IC3, which represents a combination of the circuit configurations IC1, IC2 of FIGS. 1 and 2. In such a case, first, a first transistor S1 is connected to the output of the linear output stage PA, which first transistor S1 is, on the other hand, connected to a supply potential VDD, and, second, a second transistor S2 is connected to the output of the linear output stage PA, which second transistor is, on the other hand, connected to a reference-ground potential GND. First and second transistors S1, S2 in each case have a control input E1, E2.

Regardless of whether an electrical load RL is connected to the circuit configuration IC3 in accordance with a first load case LF1 illustrated in FIG. 1 or in accordance with a second load case LF2 illustrated in FIG. 2, the circuit configuration IC3 in accordance with FIG. 3 makes it possible, when a break point occurs in the first supply line VL1 or the second supply line VL2, to connect the output OUT of the linear amplifier stage PA to the reference-ground potential GND and/or to the supply potential VDD in a low-impedance manner and, thus, first, to enable a fault state to be identified simply and, second, to avoid consequential damage due to the break in the supply lines VL1, VL2.

FIG. 4 shows a development of the circuit configuration IC3 of FIG. 3. The circuit in accordance with FIG. 4 has two control inputs E1, E2 for controlling the first transistor JF2 and the second transistor JF3, respectively. Moreover, an output OUT is provided, to which, by way of example, the output of a linear output stage can be connected, and terminals for supply and reference-ground potentials VDD, GND.

On the load side, a third and a fourth transistor JF1, JF4 are respectively disposed in series with the first and the second transistor JF2, JF3. The first to fourth transistors are realized as P-channel JFETs. Two transistors are in each case connected in series on the load side between the output OUT, which represents the first circuit node of the circuit, and supply and reference-ground potentials VDD, GND, one of which transistors can in each case be controlled by a control input E1, E2. In such a case, the source terminal of the third transistor JF1 is connected to the supply potential VDD through a first resistor R1. The drain terminal of the third transistor JF1 is connected to the source terminal of the first transistor JF2. The drain terminal of the first transistor JF2 is connected to the output OUT through a second resistor R2. The source terminal of the second transistor JF3 is, likewise, connected to the output OUT through a third resistor R3. The drain terminal of the second transistor JF3 is connected to the source terminal of the fourth transistor JF4, whose drain terminal is connected to the reference-ground potential GND. In normal operation, a potential that in each case pinches off the channel of the normally on transistors JF2, JF3 is applied to the control inputs E1, E2 of the first and the second transistor JF2, JF3, respectively. Connected to the control inputs of the four transistors JF1 to JF4 is a subcircuit TS including a plurality of diodes D1 to D5 and a plurality of resistors R1 to R7, which realizes the limiting of the power loss at high operating voltages.

In detail, in such a case, with a first diode D1 and a fourth resistor R4, which are connected in parallel with one another and are connected, on one hand, in each case to the supply potential terminal VDD and, on the other hand, to the gate of the third transistor JF1, a circuit is realized which, if the reference-ground potential VDD is large relative to the potential present at the output OUT, holds the gate of the third transistor JF1 at supply potential VDD, while the current flowing through the first resistor R1 forces the potential at the source terminal below that at the gate terminal of the third transistor JF1, and, as a result, the channel of the third transistor JF1 acquires higher impedance as the drain current increases.

A fifth diode D5, which is connected, on one hand, to the supply potential VDD and, on the other hand, to a seventh resistor R7 connected to the gate of the first transistor JF2, has the effect, together with the latter, that, if the supply potential VDD is large relative to the potential at the output OUT, the gate of the first transistor JF2 is held at supply potential VDD, while the current flowing through R1 and the channel of the first transistor JF2 has the effect that the source terminal of the first transistor JF2 is forced below the potential of the gate terminal thereof so that the channel of the first transistor JF2, in the same way as that of the third transistor JF1, also acquires higher impedance as the drain current increases. In such a case, if the gate of the first transistor JF2 breaks down at excessively high supply potentials VDD, the seventh resistor R7 limits the current to sufficiently small values so that an excessively severe degradation of the gate of the first transistor JF2 can be avoided.

A third diode D3 is connected, on one hand, to the output OUT and, on the other hand, to the gate of the second transistor JF3. The diode has the effect that, in the event of a large difference in voltage between output OUT and reference-ground potential GND, the gate terminal of the second transistor JF3 is held at the potential at the output OUT, while, through the third resistor R3, a current flow results that has the effect of forcing the potential of the source terminal below the gate potential of the second transistor JF3 so that, once again, the channel of the second transistor JF3 acquires higher impedance as the drain current increases.

With a sixth resistor R6, which is connected, on one hand, to the output OUT and, on the other hand, to the gate of the fourth transistor JF4, in the event of an excessive voltage increase at the output OUT relative to reference-ground potential GND, the gate of the fourth transistor JF4 is held at the potential present at the output OUT, while the current flow through third resistor R3 and second transistor JF3 has the effect of forcing the potential of the source terminal of the fourth transistor JF4 below the voltage present at the gate thereof so that the channel of the fourth transistor JF4 also acquires higher impedance as the drain current increases. The use of a sixth resistor R6 instead of a diode has the advantage that, in the event of a breakdown of the gate-drain junction of the fourth transistor JF4, the resistor R6 restricts the gate current thereof to avoid degeneration or degradation at the fourth transistor JF4.

A fourth diode D4, which is connected, on one hand, to the output OUT and, on the other hand, to the gate terminal of the first transistor JF2, has the effect, when an excessive voltage increase is present at the output OUT relative to supply potential VDD, that the gate of the first transistor JF2 is held at the output potential at the output OUT, while, through the second resistor R2, a current flow is established that forces the potential of the drain below that of the gate of the first transistor JF2 so that the channel thereof acquires higher impedance as the drain current increases. In such a case, in an electrical consideration, the functions of drain and source of the first transistor JF2 are interchanged.

Furthermore, a fifth resistor R5 is connected to the output OUT, with which resistor a second diode D2 is connected in series, which is connected to the gate terminal of the third transistor JF1. This circuitry of the second diode D2 with the fifth resistor R5 has the effect that, in the presence of a large potential difference between the output OUT and supply potential VDD, the gate potential is held at the potential at the output OUT, while there flows through second resistor R2 and channel of the first transistor JF2 a current that forces the potential of the drain terminal of the third transistor JF1 below that of the gate terminal of the third transistor JF1 so that, finally, the channel of the third transistor JF1 also acquires higher impedance as the drain current increases. Drain and source of the third transistor JF1 also interchange their function in an electrical consideration. The fifth resistor R5 limits the gate current for the case where the gate-source junction of the third transistor JF1 breaks down.

The described subcircuit TS for limiting the power loss, which includes the first to fifth diodes D1 to D5 and first to seventh resistors R1 to R7, serves not only for the described limiting of the power loss at high operating voltages but also for the limiting of the power loss at a negative operating voltage, that is to say, in the event of polarity reversal of the supply potential VDD. If the output OUT is, at the same time, the output of a linear output stage, then, there is established at the output OUT a potential that lies below the reference-ground potential GND in the event of a polarity reversal due to the linear output stage or a diode that does not usually exhibit polarity reversal protection, for protection against electrostatic discharges at the output. This results in a considerable current flowing through first and second resistors R1, R2 and also, on the load side, through first and third transistors JF2, JF1, which current can only be limited by the negative feedback loops described, namely, an inner loop through fourth diode D4, first transistor JF2, and second resistor R2 and also an outer feedback loop through fifth resistor R5, second diode D2, first and third transistors JF2, JF1, and also through second resistor R2. In a polarity-reversal case, the third transistor JF1 would be exposed to high gate-source voltages, which could lead to degradation of its gate-channel junction, which could gradually lead to a great, undesirable rise in its gate leakage current. In such a case, the gate terminal of the third transistor JF1 is not connected to the control input E1 so that a charge pump circuit connected thereto is not electrically loaded in an impermissible manner. The first transistor JF2 is subjected to significantly lower electrical loading even in a polarity-reversal case so that there is no risk of degradation here. Accordingly, its gate terminal is permitted to be connected to the control input E1 through protective and smoothing resistors R7, R8. This is because, in the event of a polarity reversal, in accordance with the doping profile of a P-channel JFET, the gate-substrate diode of the P-JFET would be forward-biased and, if the resistance of the first resistor R1 is set to be small, almost the entire voltage subjected to polarity reversal would be dropped across the gate-source junction of the third transistor JF1, the gate potential at the third transistor JF1 corresponding to approximately −0.5 volt and the source potential at the third transistor JF1 corresponding approximately to the sum of the supply potential VDD plus the product of first resistor R1 and supply current. In such a case, the circuit is configured for a polarity reversal strength of −18 volts.

So that the circuit configuration responds rapidly when a fault state occurs, a tenth resistor R10 and an eleventh resistor R11 are provided. The eleventh resistor R11, which is connected, on one hand, to the supply potential VDD and on the other hand to the first control input E1 of the first transistor JF2, serves to ensure that the gate of the first transistor JF2 discharges rapidly in the event of a break or interruption in the supply line carrying the reference-ground potential GND. In order, nevertheless, to keep down the current loading on a charge pump which can be connected to control inputs E1, E2, the resistance of the eleventh resistor R11 amounts to a number of megaohms. Accordingly, the leakage current occurring through R11 amounts merely to the pinch-off voltage of the transistor divided by the resistance of the eleventh resistor.

If a fault case is caused by virtue of the fact that the supply line connected to the supply potential VDD or the supply line connected to the reference-ground potential GND breaks or is interrupted, then the gate of the first and second transistors JF2, JF3 must be rapidly discharged, for which purpose a tenth resistor R10 and the eleventh resistor R11 are provided. In such a case, the tenth resistor R10 is connected between control input E1 of the first transistor and control input E2 of the second transistor JF3. Because the potentials at the control inputs E1, E2 are equal in a normal operating state, the tenth resistor R10 does not load a connected charge pump. The resistance of the tenth resistor R10, nevertheless, amounts to a few megaohms so that, in the event of a breakdown of the second transistor JF3, the first transistor JF2 remains pinched off even though the second transistor JF3 is already being operated at breakdown.

To reduce the leakage currents of the circuit in a normal operating state, two mutually decoupled charge pumps can be connected to the control inputs E1, E2, which charge pumps in each case generate a voltage that corresponds to the sum of supply potential VDD and the transistor-dependent pinch-off voltage. If one of the two pinched-off transistors JF2, JF3 breaks down, then the decoupling of the charge pumps effectively prevents the gate potential of the respective other transistor, which is still being operated in pinched-off fashion, from decreasing as well.

Connected to the gates of the first and second transistors JF2, JF3 are in each case resistors R7, R8 and R9, respectively, to which a charge pump can be connected in each case. These resistors form, with parasitic gate-drain capacitances of the first and second transistors JF2, JF3, in each case a low-pass filter that effectively prevents overcoupling of instances of ripple arising at the charge pumps to the output OUT. To keep the current loading on the charge pumps as low as possible, only two of the four JFET transistors, namely, the first and second transistors JF2, JF3, are operated in pumped fashion such that the gate potential of the first and second transistors in normal operation is greater than the supply potential plus the pinch-off voltage of the transistors.

To further avoid degeneration at the fourth transistor JF4 as a result of excessively great voltage loading, a resistor R12 is connected between gate of the fourth transistor and reference-ground potential, which resistor, together with the sixth resistor, performs voltage division of the potential at the output OUT.

Furthermore, capacitors C1, C2 are connected between source terminal of the first transistor JF2 and control input of the first and the second transistor JF2, JF3, respectively. They serve, first, for smoothing the discharge ripple in the case of charge pumps connected to the control inputs E1, E2, and, second, the capacitances are not directly connected to the reference-ground potential so that they are protected by first resistor R1 and third transistor JF1 against electrostatic discharges and against pulses caused by instances of electromagnetic coupling-in. In such a case, it should be taken into account that the time constant resulting from the product of first resistor and drain-source resistance of the third transistor JF1 and the sum of capacitances of the first and second capacitors C1, C2 is sufficiently small relative to a clock period of the charge pump frequency.

At the output OUT of the circuit, a third capacitor C3 is connected to ground, which third capacitor serves for further smoothing of the signal present at the output OUT and has a capacitance of 100 pF.

The circuit configuration in accordance with FIG. 4 can be connected through supply lines to electrical loads that can be connected either between output OUT and supply potential VDD or output OUT and reference-ground potential GND. In such a case, the circuit configuration identifies interruptions in the supply lines on account of the nonlinear characteristic curve formed and switches the output OUT to the remaining, intact supply line.

Figure 5:
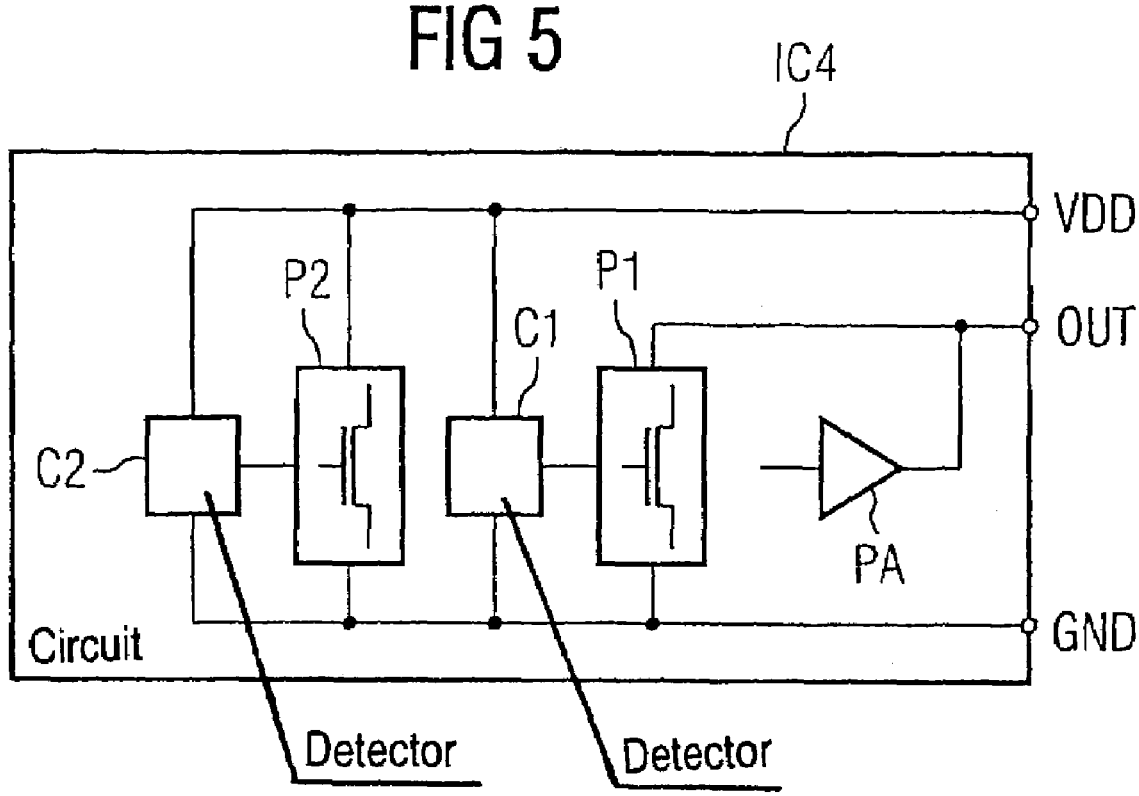
FIG. 5 is a schematic and block circuit diagram of a further exemplary embodiment according to the invention.

FIG. 5 shows an embodiment of a circuit configuration for identifying a fault state IC4 having a respective terminal for a supply potential VDD and for the reference-ground potential GND. A first normally on transistor P1, which, on the load side, is connected between output OUT and reference-ground potential GND, and a second normally on transistor P2, which, on the load side, is connected between reference-ground potential GND and supply potential VDD, are provided in this case. To drive the transistors P1, P2, a device or means for detecting a fault state C11, C12 is in each case connected to reference-ground and supply potentials VDD, GND on the input side and to a respective control input of the first and the second transistor P1, P2, respectively, on the output side. The output of a linear amplifier stage PA is connected to the second circuit node OUT. In a normal operating state, the channels of the normally on transistors P1, P2 are pinched off, while the channels are at low impedance in the event of a fault. For such a purpose, depending on the supply voltage provided by supply and reference-ground potentials VDD, GND, a suitable control voltage is generated in the device for detecting a fault state C11, C12 and is applied to the control inputs of the transistors P1, P2. To provide the pinch-off voltages for the transistors P1, P2, provision may be made of charge pumps that, in normal operation, in each case generate a gate voltage that lies outside the supply voltage.

No normally on component is provided between second reference node, embodied as output OUT, and the terminal for the supply potential VDD. This has the result of producing, when the circuit configuration is switched on, a monotonic switch-on behavior with regard to the potential at the output OUT of the output stage PA. A voltage divider including transistors as in FIGS. 3 and 4, which can lead to a non-monotonic switch-on behavior with regard to the voltage at the output OUT, is not formed.

The exemplary embodiment in accordance with FIG. 5 has an improved overvoltage behavior because the terminal for the supply potential VDD is decoupled from the output OUT. When high voltages that are higher than the supply voltage occur at the output OUT, no considerable current flow arises from the output OUT to the terminal for the supply potential VDD. In the event of a breakdown of the transistor P1, all that flows is a current from the output OUT to ground, without loading the voltage source Q. By contrast, when an overvoltage occurs at the supply potential terminal VDD, the current flowing from the supply potential to the reference-ground potential through transistor P2 advantageously does not influence the potential at the output OUT so that the output stage PA can be constructed with a small driver capability and the potential at the output OUT can, nevertheless, be held at reference-ground potential GND.

Figure 6:
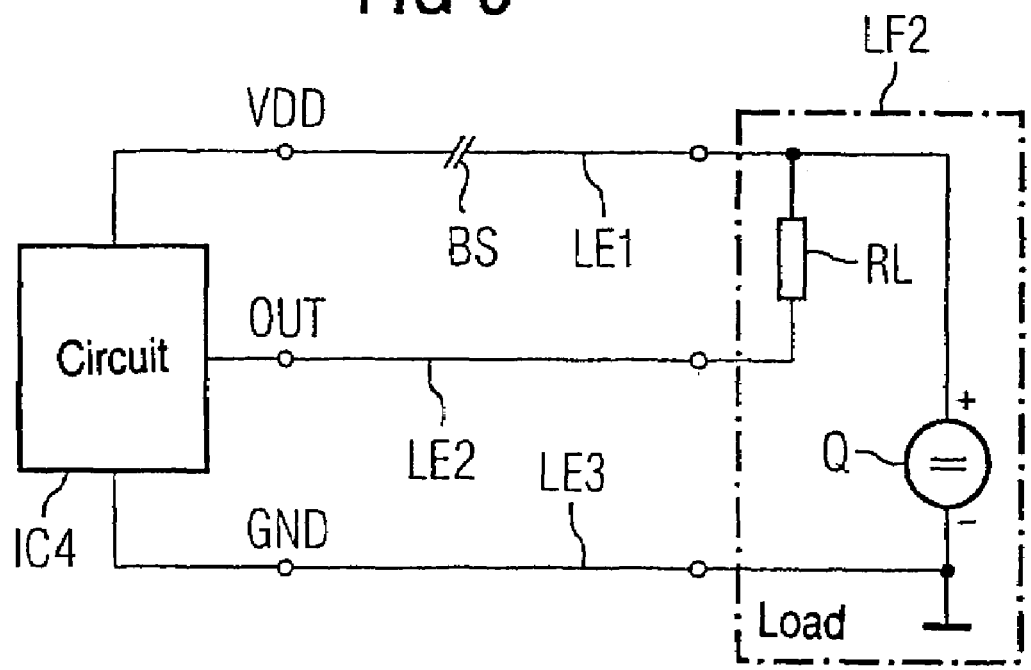
FIG. 6 is a schematic and block circuit diagram of the circuit of FIG. 5 applied to the second load case.

FIG. 6 shows an application of the circuit configuration of FIG. 5 to a second load case LF2, in which a load resistor RL connected as pull-up load is connected through a respective long line LE1, LE2 to supply potential terminal VDD and output OUT of the circuit configuration IC4. An external voltage source Q is connected to the terminal for the supply potential VDD through the long line LE1 and to the terminal for the reference-ground potential GND through a long line LE3.

If a break point BS occurs on one of the lines LE1, LE3 carrying the supply voltage, then the circuit configuration sets at the output OUT a potential that corresponds to that of the remaining, intact line. In the case where there is a break in the line LE1, a low-impedance connection between output OUT and terminal for the reference-ground potential GND is produced through the transistor P1. Even with the provision of a pull-up load resistor RL, which normally pulls the potential at the output OUT to supply potential VDD, the potential of the output OUT virtually remains, as desired, at reference-ground potential GND because the resistance of the low-impedance transistor P1 of approximately 100 ohms is small relative to the load resistor RL, whose value is approximately 10 kohms. In the case where there is a break in the line LE3, a low-impedance connection between output OUT and terminal for supply potential VDD is produced through the series circuit including transistor P1 and transistor P2.

If, for providing the pinch-off voltage, provision is made of charge pumps that are usually operated in clocked fashion, then, the described embodiment of the circuit configuration reduces the interference voltage ripple occurring at the output OUT due to parasitic capacitances of the transistors P1, P2 because only one transistor P1, and not two, is directly connected to the output OUT.

We claim:

1. A circuit configuration for identifying a fault state, comprising:

three terminals including:
 a first circuit node to be connected to a voltage source through an electrical load;
 a supply terminal to be connected to the voltage source, said supply terminal supplying a supply potential from the voltage source; and
 a ground terminal to be connected to the voltage source, said ground terminal supplying a reference-ground potential;

a signal-processing circuit having an output connected to said first circuit node;

a normally on type first transistor having:
 a channel;
 a control input;
 a first load terminal connected to said first circuit node; and
 a second load terminal connected to said supply terminal;

a second transistor having:
 a channel;
 a first load terminal connected to said ground terminal;
 a second load terminal connected to said first circuit node; and
 a control input having a voltage present thereat pinching off said channel of said second transistor in said normal operating state;

a third transistor having a load side connected to said supply terminal and to said first transistor; and a fourth transistor having a load side connected to said second transistor and to said ground terminal;

said third and said fourth transistors each having control inputs;

a power loss limiting subcircuit being connected to said control inputs of said first, said second, said third, and said fourth transistors;

said third transistor and said first transistor forming a series connection coupled between said supply terminal and said first circuit node;

said second transistor and said fourth transistor forming a series connection coupled between said first circuit node and said ground terminal;

said third transistor including a load terminal;

a first resistor being connected between said supply terminal and said load terminal of said third transistor;
a second resistor being connected between said first circuit node and said first load terminal of said first transistor;
a third resistor being connected between said first circuit node and said second load terminal of said second transistor;
a first diode;
a fourth resistor being connected in parallel with said first diode between said supply terminal and said control input of said third transistor;
a fifth resistor being connected to said first circuit node;
a second diode being connected to said control input of said third transistor and in series with said fifth resistor with respect to said first circuit node;
a sixth resistor being connected to said first circuit node and to said control input of said fourth transistor;
a third diode being connected to said first circuit node and to said control input of said first transistor;
a fourth diode being connected to said first circuit node and to said control input of said second transistor;
a seventh resistor being connected to said control input of said first transistor;
a fifth diode being connected to said supply terminal, and to said seventh resistor;
said control input of said first transistor having a voltage present thereat pinching off said channel of said first transistor in a normal operating state;
said first and second load terminals of said first transistor being connected in a low-impedance manner through said channel in a fault state; and
in a first load case, an electrical load being:
connected to said first circuit node; and
connected to said ground terminal.

2. The circuit configuration according to claim 1, including a supply line connected to the circuit configuration and adapted to connect the voltage source to one of said supply terminal and said ground terminal, the fault state existing when one of the following is true: said supply line is interrupted or said supply line has a voltage below a minimum voltage limit.

3. The circuit configuration according to claim 1, including a supply line for connecting the voltage source to one of said supply terminal and said ground terminal, the fault state existing when one of the following is true: said supply line is interrupted or said supply line has a voltage below a minimum voltage limit.

4. The circuit configuration according to claim 1, wherein said signal-processing circuit is a linear output stage.

5. The circuit configuration according to claim 1, wherein:
in a first load case, the first circuit node is to be connected to the electrical load and said ground is to be connected to the electrical load.

6. The circuit configuration according to claim 1, wherein said first and second transistors are P-channel JFETs.

7. The circuit configuration according to claim 1, wherein said first and second transistors are N-channel JFETs.

8. The circuit configuration according to claim 1, wherein:
said first transistor and said second transistor each have said control terminals;
a first gate discharge resistor is connected to said control terminal of said first transistor and to said control terminal of said second transistor;
a second gate discharge resistor is connected to said control input of said first transistor and to said supply terminal.

9. The circuit configuration according to claim 1, including gate discharge resistors, a first of said gate discharge resistors being connected to said control input of said first transistor and to said control input of said second transistor, a second of said gate discharge resistors being connected to said control input of said first transistor and to said supply terminal.

10. The circuit configuration according to claim 1, including gate discharge resistors, a first of said gate discharge resistors being connected to said control input of said first transistor and to said control input of said second transistor, a second of said gate discharge resistors being connected to said control input of said first transistor and to said supply terminal.

11. The circuit configuration according to claim 1, including gate discharge resistors, a first of said gate discharge resistors being connected to said control input of said first transistor and to said control input of said second transistor, a second of said gate discharge resistors being connected to said control input of said first transistor and to said supply terminal.

12. The circuit configuration according to claim 1, including smoothing capacitors, a first of said smoothing capacitors being connected between said second load terminal of said first transistor and said control input of said first transistor, a second of said smoothing capacitors being connected between said control input of said second transistor and said second load terminal of said first transistor.

13. The circuit configuration according to claim 1, including smoothing capacitors, a first of said smoothing capacitors being connected between said second load terminal of said first transistor and said control input of said first transistor, a second of said smoothing capacitors being connected between said control input of said second transistor and said second load terminal of said first transistor.

14. The circuit configuration according to claim 1, including smoothing capacitors, a first of said smoothing capacitors being connected between said second load terminal of said first transistor and said control input of said first transistor, a second of said smoothing capacitors being connected between said control input of said second transistor and said second load terminal of said first transistor.

15. The circuit configuration according to claim 1, including a second transistor having a first load terminal connected to said ground terminal and a second load terminal connected to said supply terminal.

16. The circuit configuration according to claim 1, including a means for detecting the fault state, said detecting means having:
an input side connected to said supply terminal and to said ground terminal; and
an output side connected to said first transistor.

17. The circuit configuration according to claim 1, including a fault state detector for detecting the fault state, said detector having:
an input side connected to said supply terminal and to said ground terminal; and
an output side connected to said first transistor.

18. A circuit configuration for identifying a fault state, comprising:
three terminals including:
a first circuit node to be connected to a voltage source through an electrical load;
a supply terminal to be connected to the voltage source, said supply terminal supplying a supply potential from the voltage source; and a ground terminal to be connected to the voltage source, said ground terminal supplying a reference-ground potential;
a signal-processing circuit having an output connected to said first circuit node;
a normally on type first transistor having:
 a channel;
 a control input;
 a first load terminal connected to said first circuit node; and
 a second load terminal connected to said supply terminal;
a second transistor having:
 a channel;
 a first load terminal connected to said ground terminal;
 a second load terminal connected to said first circuit node; and
 a control input having a voltage present thereat pinching off said channel of said second transistor in said normal operating state;
smoothing capacitors, a first of said smoothing capacitors being connected between said second load terminal of said first transistor and said control input of said first transistor, a second of said smoothing capacitors being connected between said control input of said second transistor and said second load terminal of said first transistor;
a third transistor having a load side connected to said supply terminal and to said first transistor; and
a fourth transistor having a load side connected to said second transistor and to said ground terminal;
said third transistor and said first transistor forming a series connection coupled between said supply terminal and said first circuit node;
said second transistor and said fourth transistor forming a series connection coupled between said first circuit node and said ground terminal;
said control input of said first transistor having a voltage present thereat pinching off said channel of said first transistor in a normal operating state;
said first and second load terminals of said first transistor being connected in a low-impedance manner through said channel in a fault state;
in a first load case, an electrical load being:
 connected to said first circuit node; and
 connected to said ground terminal.

19. The circuit configuration according to claim 18, wherein:
 said third and said fourth transistors each have control inputs; and
 a power loss limiting subcircuit is connected to said control inputs of said first, said second, said third, and said fourth transistors.

\* \* \* \* \*